US012593724B2

(12) United States Patent
Peng et al.

(10) Patent No.: US 12,593,724 B2
(45) Date of Patent: Mar. 31, 2026

(54) SEMICONDUCTOR DEVICES AND METHODS FOR MANUFACTURING THE SAME

(71) Applicant: Hangzhou Guangzhiyuan Technology Co., Ltd., Hangzhou City (CN)

(72) Inventors: Bo Peng, Hangzhou City (CN); Huaiyu Meng, Hangzhou City (CN); Yichen Shen, Hangzhou City (CN)

(73) Assignee: HANGZHOU GUANGZHIYUAN TECHNOLOGY CO., LTD, Hangzhou City (CN)

( * ) Notice: Subject to any disclaimer, the term of this patent is extended or adjusted under 35 U.S.C. 154(b) by 719 days.

(21) Appl. No.: 17/826,791

(22) Filed: May 27, 2022

(65) Prior Publication Data

US 2022/0384409 A1 Dec. 1, 2022

(30) Foreign Application Priority Data

May 31, 2021 (CN) .......................... 202110598491.4

(51) Int. Cl.
H01L 25/18 (2023.01)
H01L 23/00 (2006.01)
(Continued)

(52) U.S. Cl.
CPC ............ H01L 25/18 (2013.01); H01L 23/481 (2013.01); H01L 24/16 (2013.01); *H01L 21/565* (2013.01);
(Continued)

(58) Field of Classification Search
None
See application file for complete search history.

(56) References Cited

U.S. PATENT DOCUMENTS

2019/0333905 A1   10/2019   Raghunathan et al.
2020/0310052 A1   10/2020   Lim et al.
(Continued)

FOREIGN PATENT DOCUMENTS

CN        112005370 A     11/2020
TW        202034001 A      9/2020
(Continued)

OTHER PUBLICATIONS

First Search Report issued in CN Application No. 202110598491.4; mailed Jun. 18, 2021; 2 pgs.
(Continued)

*Primary Examiner* — Hung K Vu
(74) *Attorney, Agent, or Firm* — HAUPTMAN HAM, LLP

(57) ABSTRACT

The present invention relates to the field of photonic integrated circuits and provides a semiconductor device and a manufacturing method thereof. The semiconductor device includes an EIC chip and a PIC chip arranged on a substrate, the EIC chip is located between the PIC chip and the substrate. In embodiments, at least one EIC chip is disposed on a surface of a single PIC chip facing the substrate, and the EIC chip is mounted on the substrate through a connection structure. Therefore, the wiring of the PIC chip in the semiconductor device of the present invention is optimized such that the voltage drop due to long wiring distance can be suppressed, and the package structure of the semiconductor device is also optimized.

14 Claims, 3 Drawing Sheets

(51) Int. Cl.
| | |
|---|---|
| *H01L 23/48* | (2006.01) |
| *H01L 21/56* | (2006.01) |

(52) U.S. Cl.
CPC .............. *H01L 24/24* (2013.01); *H01L 24/73* (2013.01); *H01L 2224/16148* (2013.01); *H01L 2224/16235* (2013.01); *H01L 2224/24145* (2013.01); *H01L 2224/73209* (2013.01); *H01L 2224/73259* (2013.01); *H01L 2924/182* (2013.01)

(56) References Cited

U.S. PATENT DOCUMENTS

| | | | |
|---|---|---|---|
| 2020/0395347 A1 | 12/2020 | Yu et al. | |
| 2021/0096310 A1* | 4/2021 | Chang ..................... | H01L 24/19 |
| 2021/0159347 A1 | 5/2021 | Butler et al. | |

FOREIGN PATENT DOCUMENTS

| | | |
|---|---|---|
| TW | 202109808 A | 3/2021 |
| TW | 202114130 A | 4/2021 |

OTHER PUBLICATIONS

First Office Action issued in CN Application No. 202110598491.4; mailed Jul. 1, 2021; 15 pgs.

Second Office Action issued in CN Application No. 202110598491.4; mailed Jul. 22, 2021; 16 pgs.

Supplementary Search Report issued in CN Application No. 202110598491.4; mailed Aug. 19, 2021; 1 pg.

Notification to Grant Patent issued in CN Application No. 202110598491.4; mailed Aug. 25, 2021; 5 pgs.

First Office Action in Corresponding Taiwan Application No. 111119878, dated Dec. 7, 2011; 14 pgs.

Rejection Decision in Corresponding Taiwan Application No. 111119878.2, dated Nov. 27, 2023; 14 pgs.

Second Office Action in Corresponding Taiwan Application No. 111119878, dated May 26, 2012; 14 pgs.

Third Office Action in Corresponding Taiwan Application No. 111119878, dated Oct. 4, 2023; 14 pgs.

* cited by examiner

SEMICONDUCTOR DEVICES AND METHODS FOR MANUFACTURING THE SAME

CROSS-REFERENCE TO RELATED APPLICATION(S)

This application claims the benefit of, and priority to, the Chinese Patent Application No. 202110598491.4, filed on May 31, 2021, which is herein incorporated by reference in its entirety.

FIELD OF THE INVENTION

The present invention relates to the field of photonic integrated circuits, and more particularly, to a semiconductor device and a manufacturing method thereof.

BACKGROUND OF THE INVENTION

In recent years, with the rapid development of artificial intelligence technology, some neural network algorithms involved require a large number of matrix operations. So far, it has been proposed to use photonic computing to perform said matrix operations. The photonic computing uses light as the carrier of information, and realizes light transmission, processing, and calculation through optical devices/chips.

In an existing solution for implementing a photonic computing system, an electronic integrated circuit (EIC) chip and a photonic integrated circuit (PIC) chip need to be electrically connected to each other. As the chips are large, the wirings for connecting the two chips are long. Due to the resistance in the wiring, the voltage drop caused by the current flowing through the wiring is not negligible and leads to extra power consumption. Excessive voltage drop may also cause the system to fail to work properly. In addition, in application scenarios such as photonic computing chips, in order to realize the transmission of a large amount of data and signals and the electrical connection, both EIC chip and PIC chip have a plurality of connection points and a plurality of wirings corresponding thereto, which further leads to undesirable voltage drop. Furthermore, the PIC chip sometimes needs to be optically coupled with external devices, which greatly limits the overall integration of a semiconductor device.

SUMMARY OF THE INVENTION

The invention provides a semiconductor device and a manufacturing method thereof, which can effectively suppress the voltage drop, optimize the electrical connection between a PIC chip and an EIC chip, and optimize the package size.

In one aspect, embodiments of the present invention provide a semiconductor device comprising a substrate; a PIC chip; an EIC chip disposed between the PIC chip and the substrate; wherein the PIC chip is electrically connected to the EIC chip.

In some embodiments, the PIC chip includes a PIC wiring structure, and the EIC chip includes an EIC wiring structure. The semiconductor device further comprises an electrical connection path from the PIC chip to the substrate, which successively passes through the PIC wiring structure and the EIC wiring structure.

In some embodiments, the semiconductor device further comprises a packaging material disposed in at least a portion of the periphery of the EIC chip, a via conductive structure disposed in the packaging material, and an electrical connection path from the PIC chip to the substrate. Wherein the electrical connection path passes through the via conductive structure.

In some embodiments, the semiconductor device includes at least one structure of a PIC rewiring structure, a first bonding structure, a first EIC rewiring structure, a second EIC rewiring structure, a via conductive structure, and a second bonding structure, wherein the at least one structure is configured such that:

the electrical connection path from the PIC wiring structure to the EIC wiring structure successively passes through at least one of the PIC rewiring structure, the first bonding structure, the first EIC rewiring structure, and/or the electrical connection path from the EIC wiring structure to a substrate wiring structure successively passes through at least one of the second EIC rewiring structure, the via conductive structure, and the second bonding structure.

In some embodiments, the semiconductor device comprises at least two EIC chips including a first EIC chip and a second EIC chip, a packaging material disposed between the first EIC chip and the second EIC chip, and at least one via conductive structure disposed in the packaging material. In some embodiments, two or more via conductive structures are disposed around the first EIC chip, among which at least one via conductive structure whose wiring distance from the first EIC chip is not the farthest is connected to the first EIC chip.

In some embodiments, the semiconductor device comprises a first bonding structure for connecting the EIC chip to the PIC chip and a connection structure for connecting the EIC chip to the substrate. The connection structure includes a first segment electrically connected to the first bond structure, a second segment electrically connected to the first segment, and a second bonding structure for connecting the second segment to the substrate.

In some embodiments, the first segment of the connection structure extends laterally from the connection point of the first bond structure on the EIC chip and beyond the EIC chip. The second segment of the connecting structure extends longitudinally from the first segment of the connecting structure toward the substrate and terminates at the second bonding structure.

In some embodiments, the semiconductor device further comprises a packaging material disposed in at least a portion of the periphery of the EIC chip surrounding the second segment of the connecting structure.

In some embodiments, the second segment of the connection structure includes a via conductive structure formed in the packaging material.

In some embodiments, the first segment connection structure includes a redistribution metal layer formed on the EIC chip and its packaging material.

In some embodiments, the projected area of the PIC chip toward the substrate is greater than the sum of the projected areas of the at least one EIC chip toward the substrate.

In some embodiments, the semiconductor device comprises a plurality of EIC chips arranged in a matrix, wherein the packaging material is disposed between adjacent EIC chips and surrounds the second segment of the connecting structure.

In some embodiments, for at least one EIC chip among the plurality of EIC chips, a plurality of the second segments are provided around the at least one EIC chip, among which the second segment whose wiring distance from the at least one EIC chip is not the farthest is connected to the at least one EIC chip. In an optional embodiment, the second segment with the shortest wiring distance is connected to the at least one EIC chip.

In another aspect, embodiments of the present invention provide a method for manufacturing a semiconductor device, comprising: providing a substrate, an EIC chip and a PIC chip; electrically connecting the EIC chip and the substrate; and electrically connecting the EIC chip and the PIC chip such that the EIC chip is disposed between the PIC chip and the substrate.

In some embodiments, the method further comprises disposing a packaging material in at least a portion of the periphery of the EIC chip and providing a via conductive structure in the packaging material, wherein the electrical connection path from the PIC chip to the substrate passes through the via conductive structure.

In some embodiments, the method comprises providing at least two EIC chips including a first EIC chip and a second EIC chip, disposing a packaging material between the first EIC chip and the second EIC chip, and providing at least one via conductive structure in the packaging material.

According to the embodiments of the present invention, the EIC chip is disposed between the PIC chip and the substrate and the PIC chip is electrically connected to the EIC chip, such that the PIC chip can be electrically connected to the substrate through the EIC chip and the connection structure. Compared with the existing wiring using a wire bonding method, the wiring distance from the PIC chip to the substrate is shorten, such that the voltage drop due to long wiring distance can be reduced. In addition, in the semiconductor device, a plurality of smaller EIC chips can be used to replace the prior larger EIC chip, and at least one smaller EIC chip can be connected to the substrate through a connection structure located adjacent to it, thereby further shortening the electrical connection distance and further suppressing the voltage drop. Therefore, the performance of the semiconductor device can be improved.

Aspects, features, advantages and the like of the embodiments will be described in greater detail by reference to the drawings. The aspects, features, advantages and the like will be apparent according to the detailed description by reference to the drawings.

DETAILED DESCRIPTION OF THE INVENTION

In order to facilitate understanding of various aspects, features and advantages of the technical solutions of the present invention, the present invention will be described in detail below with reference to the drawings. It should be understood that the following various embodiments are intended only for illustration, but not for limiting the protection scope of the present invention.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises", "comprising", "includes" and "including" "has", "have" and "having" when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of" when preceding a list of elements, modify the entire list of elements and do not modify the individual element of the list.

Figure 1:
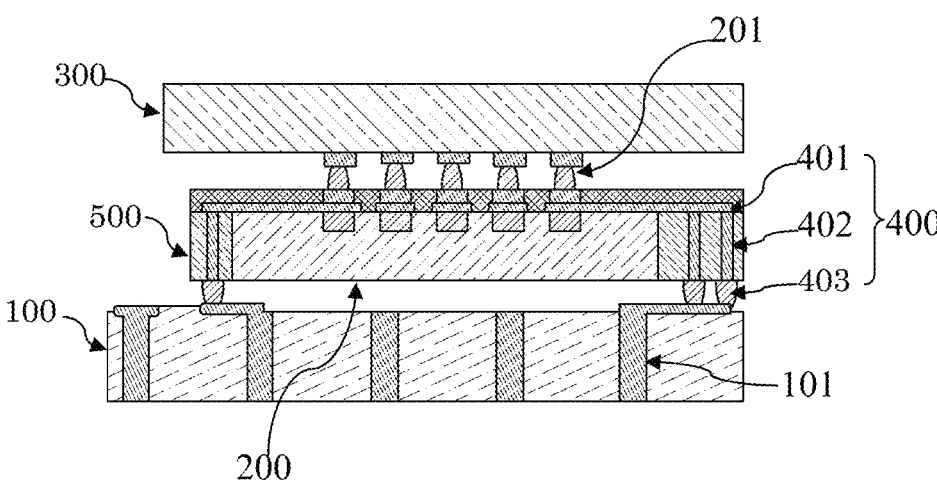
FIG. 1 is a cross-sectional view exemplarily showing the structure of a semiconductor device according to an embodiment of the present invention.
Figure 2:
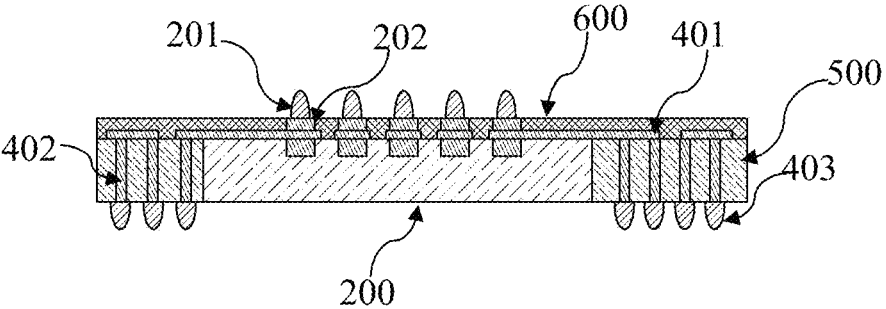
FIG. 2 is a cross-sectional view exemplarily showing a partial structure of a semiconductor device according to an embodiment of the present invention.
Figure 3:
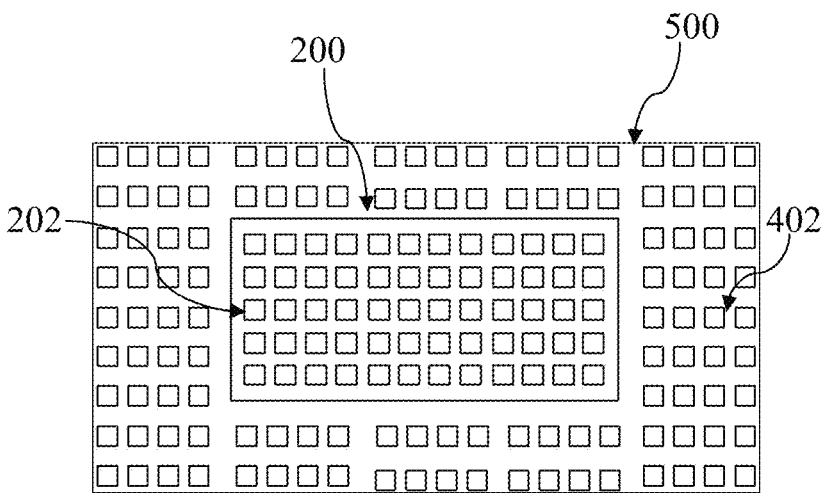
FIG. 3 is a schematic diagram illustrating a plan layout of a partial structure of a semiconductor device according to an embodiment of the present invention.

FIG. 1 exemplarily shows the structure of a semiconductor device according to an embodiment of the present invention. FIG. 2 exemplarily shows a partial structure of a semiconductor device according to an embodiment of the present invention, omitting a PIC chip. FIG. 3 exemplarily shows a plan layout of a partial structure of a semiconductor device according to an embodiment of the present invention, which omits a PIC chip, a surface cover layer, and a Redistribution Metal Layer (RDL). An embodiment of the present invention will be described below with reference to FIGS. 1-3.

In an embodiment of the present invention, the semiconductor device includes a PIC chip 300 and an EIC chip 200 disposed on a substrate 100, and the EIC chip 200 is located between the PIC chip 300 and the substrate 100. Wherein the EIC chip and the PIC chip may be set directly opposite to each other, or may not be completely opposite to each other. In this embodiment, one EIC chip 200 is disposed on a first surface of a single PIC chip 300, which faces the substrate 100. The EIC chip 200 has a first surface facing the PIC chip 300 and a second surface facing the substrate 100. The EIC chip 200 is mounted on the substrate 100 through a connection structure 400.

In this embodiment, the EIC chip 200 is connected to the PIC chip 300 through a first bonding structure. The first bonding structure may include a plurality of microbumps 201 formed of solder. The plurality of microbumps 201 which are formed on a plurality of connection points 202 of the EIC chip 200 are connected to the connection points on the PIC chip 300 to bond the EIC chip and the PIC chip. In alternative embodiments of the present invention, the first bonding structure may include other bonding structures such as solder balls.

In this embodiment, the projected area of the PIC chip 300 toward the substrate 100 is larger than the projected area of the EIC chip 200 toward the substrate 100, and a packaging material 500 such as a molding compound is provided at the periphery of the EIC chip. In some embodiments, the projected area of the PIC chip 300 may be equal to or smaller than that of the EIC chip 200, and a packaging material 500 may also be provided at the periphery of the EIC chip. In some embodiments, the packaging material may be provided in at a portion of the periphery of the EIC chip, for example, on the side where the wiring distance from the EIC chip to the substrate is shorter or the shortest.

The connection structure 400 includes a first segment electrically connected to the first bond structure, a second segment electrically connected to the first segment, and a second bonding structure electrically connected to the second connecting structure. In this embodiment, the first segment of the connection structure includes a RDL layer 401 formed on the EIC chip 200 and its packaging material 500, the second segment of the connection structure includes a via conductive structure 402 formed in the packaging material 500, and the second bonding structure includes a solder ball 403 for connecting the EIC chip 200 to the substrate 100. The electrical signals can be transmitted from the EIC chip to the substrate through the via conductive structure 402 adjacent to the EIC chip, such that the overall conductive connection distance is reduced. The number of via conductive structure connected to an EIC chip at the periphery of the EIC chip can be one or more (for example, 2 or more). For example, 8, 6, 8, and 6 via conductive structures are arranged on the four sides of an EIC chip, respectively. In some cases, one or more certain sides of the EIC chip may not be provided with any via conductive structure connected thereto.

In this embodiment, the RDL layer 401 extends laterally from the connection points connected to the plurality of microbumps 201 beyond the EIC chip 200; a plurality of via conductive structures 402 extend longitudinally from the RDL layer 401 toward the substrate 100 and terminate at a plurality of solder balls 403; the plurality of solder balls 403 are electrically connected to the wiring structures 101 disposed on or in the substrate 100, or are further connected to external wirings and/or ports. Therefore, the wiring path of the PIC chip 300 of the present embodiment are built to the substrate 100 from the connection points of the PIC chip 300 through the micro-bumps 201, the RDL layer 401, the via conductive structures 402 and the solder balls 403. Compared with the existing wiring using a wire bonding method, the wiring of the embodiment is simpler and shorter, such that the voltage drop can be reduced. In this embodiment, a plurality of openings are formed in the packaging material 500, and conductive materials are formed in the openings, thereby forming the via conductive structures 402 that are connected to the substrate 100 through solder balls 403. The RDL layer 401 is formed on the surface of the packaging material 500 and the EIC chip 200, and electrically connects the via conductive structures 402 to the EIC chip 200 and the PIC chip 300. In this embodiment, a surface covering layer 600 is formed on the surface of the RDL layer 401 for protecting the RDL layer 401. As shown in FIG. 3, similar to the wirebond pads, the via conductive structures 402 can be arranged as close as possible to the EIC chip 200 to shorten the wiring line, the PIC chip 300, the RDL layer 401 and the surface covering layer 600 are not shown in the figure.

In some embodiments, the PIC chip 300 may include a PIC wiring structure (not shown), and the EIC chip 200 may include an EIC wiring structure (not shown). The conductive path or electrical connection path from the PIC chip 300 to the substrate successively passes through the PIC wiring structure (PIC chip) and the EIC wiring structure (EIC chip), and may terminate at the substrate (wirings on the substrate) or further pass through the substrate to the other devices on the substrate. In some embodiments, the conductive path passes through the PIC wiring structure, the EIC wiring structure, and the via conductive structure 402 in sequence. Optionally, the conductive path from the PIC chip 300 to the substrate 100 may sequentially passes through the PIC wiring structure (PIC chip), a PIC rewiring structure, a first bonding structure, a first EIC rewiring structure, the EIC wiring structure (EIC chip), a second EIC rewiring structure, a via conductive structure, and a second bonding structure, wherein at least one of the first bonding structure, the PIC rewiring structure, the first EIC rewiring structure, the second EIC rewiring structure, and the second bonding structure is optional. In addition, an additional bonding structure may be provided for connecting the above-mentioned wiring structures, rewiring structures, PIC chip, EIC chip, etc. For example, the first bonding structure such as the microbump 201 is used for connecting the PIC chip and the EIC chip, and the second bonding structure such as the solder ball 403 is used for connecting the EIC chip 200 and the substrate 100. The aforementioned rewiring structures may include a RDL layer. By configuring the conductive paths, a method suitable for electrically connecting the PIC chip and the EIC chip is provided and the electrical connection is optimized. In some embodiments, the first segment of the connection structure 400 between the EIC and the substrate includes the second EIC rewiring structure (for example, the RDL layer 401), and the second segment of the connection structure 400 includes the via conductive structure.

Optionally, the first bonding structure is not necessary for electrically connecting the EIC chip 200 and the PIC chip 300. Instead, both chips can be bonded by diffusion approach. For example, under pressure and heating conditions, Cu in the EIC wiring structure and Cu in the PIC wiring structure diffuse and bond to each other, such that the EIC chip and the PIC chip are bonded.

In some embodiments, the RDL layer 401 may have 5 copper layers, and the thickness of each layer is about 7.5 um. Compared with the existing metal wire bonding on the PIC chip, the impedance of the RDL layer 401 is more than 24 times smaller. In an optional embodiment of the present invention, the RDL layer 401 may be other structures, for example, the RDL layer 401 may have other number of conductor layers of other materials such as 4 or 5 layers, the thickness of each layer may be other values, and each layer can vary in thickness.

In an optional embodiment of the present invention, the second bonding structure may also be a bonding structure other than solder balls in the art, such as solder bumps.

Although the present invention is described taking one flip-chipping EIC chip on a PIC chip as an illustrative embodiment with reference to the accompanying drawings. The present invention is not limited to the illustration, for example, at least two EIC chips may be flip-chipped on the PIC chip.

Figure 4:
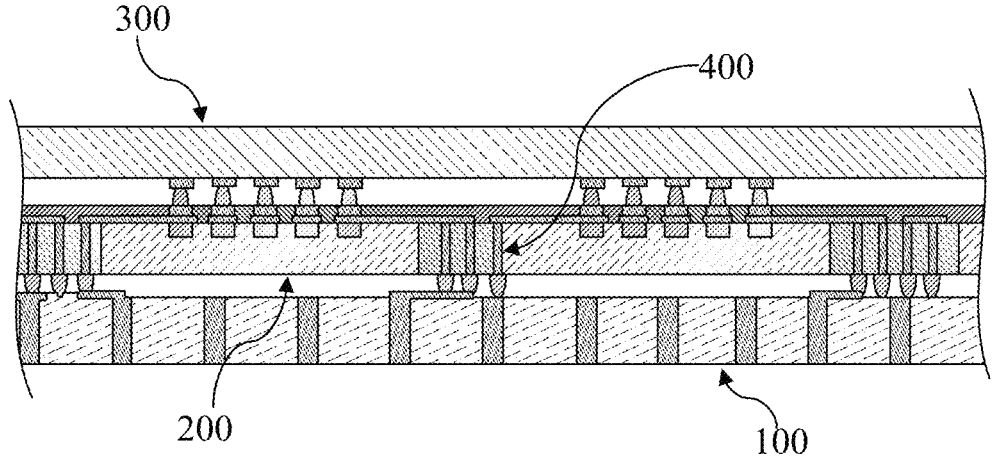
FIG. 4 is a cross-sectional view exemplarily showing the structure of a semiconductor device according to another embodiment of the present invention.

FIG. 4 exemplarily shows the structure of a semiconductor device according to another embodiment of the present invention. In this embodiment, the semiconductor device includes a plurality of EIC chips 200, a PIC chip 300, and the substrate 100, and the plurality of EIC chips 200 are located between the PIC chip 300 and the substrate 100. In this embodiment, a plurality of EIC chips 200 are flip-chipped on the surface of a single PIC chip 300 facing the substrate 100, and the plurality of EIC chips 200 are respectively mounted on the substrate 100 through the connection structure 400. The connection structure 400 is similar to that as described in the above embodiment, and will not be repeated here.

The difference between this embodiment and the embodiment shown in FIG. 1 lies in the number and layout of the EIC chips 200. In this embodiment, the number of the EIC chips 200 may be 2, 3 or more. The projected area of the PIC chip 300 facing the substrate 100 is greater than the sum of the projected areas of the plurality of EIC chips 200 facing the substrate. The electrical signals can be transmitted from one of the plurality of EIC chips 200 to the substrate through the via conductive structure adjacent to the EIC chip, such that the overall conductive connection distance is reduced. In addition, the plurality of EIC chips (at least two EIC chips) include a first EIC chip and a second EIC chip, wherein the via conductive structures may be arranged around each of the first EIC chip and the second EIC chip, so that the first and/or second EIC chips can be connected to the via conductive structures in close proximity, such that the electrical connection is optimized. In some embodiments, 16 via conductive structures are provided between the first and second EIC chips, among which 6 are connected to the first EIC chip and 10 are connected to the second EIC chip. In some embodiments, the plurality of EIC chips are arranged in the form of a matrix (not shown), and a packaging material may be provided between adjacent EIC chips and surrounds the second segment of the connection structure (such as via conductive structures). In addition, for at least one EIC chip in the plurality of EIC chips 200, a plurality of the second segments are provided around the at least one EIC chip among which the second segment whose wiring distance from the at least one EIC chip is not the farthest is connected to the at least one EIC chip. In other words, the connection structure including the second segment with a relatively short wiring distance from the EIC chip is used for connection. In some embodiments, the second segment with the shortest wiring distance is connected to the EIC chip. For example, in an exemplary application, a semiconductor device comprises 9 EIC chips arranged in 3×3 matrix, a packaging material disposed between adjacent EIC chips, and one and/or more openings accommodating connection conductors provided in the packaging material. For a certain EIC chip, one or more openings with the shorter or shortest wiring distance from the EIC chip can be connected to the EIC chip. In an optional embodiment of the present invention, all EIC chips can be connected to the second segment with the shortest or relatively short wiring distance from them.

In alternative embodiments, for a smaller number of EIC chips, the arrangement of the EIC chips may be linear, for example, 2, 3 or 4 EIC chips are arranged in a line.

In the embodiments of the present invention, a plurality of EIC chips (two or more) are used to replace one EIC chip that should be required by the semiconductor device according to the prior art, and some or all of the plurality of EIC chips are connected to the substrate through the connection structure located in the vicinity thereof, thereby shortening the electrical connection distance and reducing the voltage drop.

Figure 5:
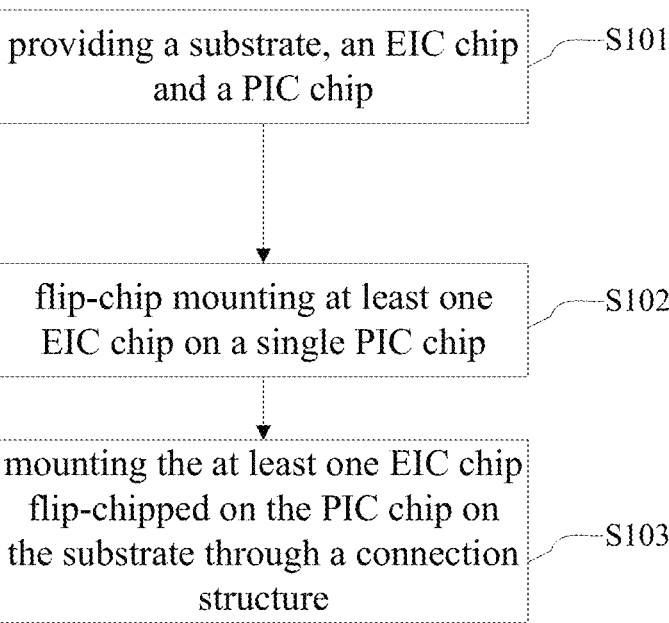
FIG. 5 is a flowchart exemplarily showing a method for manufacturing a semiconductor device according to an embodiment of the present invention.

FIG. 5 exemplarily shows a flow of a method for manufacturing a semiconductor device according to an embodiment of the present invention. The method includes following steps:

at S101, providing a substrates, an EIC chip and a PIC chip;

at S102, flip-chip mounting at least one EIC chip on a single PIC chip;

at S103, mounting the at least one EIC chip flip-chipped on the single PIC chip on the substrate through a connection structure, so that the least one EIC chip is located between the PIC chip and the substrate.

In some embodiments, the at least one EIC chip is connected to the PIC chip through a first bonding structure (such as solder balls, microbumps, and the like). The connection structure includes a first segment (such as a RDL layer) electrically connected to the first bonding structure, a second segment (such as a via conductive structure) electrically connected to the first segment, and a second bonding structure (such as solder balls) electrically connected to the second segment. Wherein the at least one EIC chip is connected to the substrate through the second bonding structure.

In some embodiments, the method further includes disposing a packaging material at at least a part of the periphery of the at least one EIC chip; forming a redistribution metal layer (RDL) on the at least one EIC chip and its packaging material, wherein the first segment of the connection structure includes the RDL layer; forming a via conductive structure in the packaging material, wherein the second segment of the connection structure includes the via conductive structure.

In some embodiments, the projected area of the PIC chip toward the substrate is greater than the sum of the projected areas of the at least one EIC chip toward the substrate. In alternative embodiments, for a single EIC chip, the projected area of the PIC chip toward the substrate may be equal to or smaller than the projected area of the EIC chip toward the substrate.

In some embodiments, a plurality of EIC chips may be arranged in a matrix. For at least one EIC chip among the plurality of EIC chips, a plurality of second segments are provided around the at least one EIC chip among which the second segment whose wiring distance from the at least one EIC chip is not the farthest (i.e., the second segment is relatively close to the at least one EIC chip) is connected to the at least one EIC chip. In an optional embodiment of the present invention, the second segment with the shortest wiring distance from the at least one EIC chip is connected to the at least one EIC chip. It can be seen that the wiring of the PIC chip is optimized by using the above-mentioned connection structure. Specifically, the embodiments of the present invention use a simple wiring structure to shorten the wiring distance and reduce the voltage drop.

In alternative embodiments, a plurality of EIC chips may be arranged in a linear arrangement. For example, two EIC chips are arranged in a row or column.

In some embodiments, a method for manufacturing a semiconductor device comprises: providing a substrate, an EIC chip and a PIC chip; electrically connecting the EIC chip and the substrate; electrically connecting the EIC chip and the PIC chip such that the EIC chip is located between the PIC chip and the substrate. Optionally, a packaging material is provided at at least a part of the periphery of the EIC chip, a via conductive structure is disposed in the packaging material, and the electrical connection path from the PIC chip to the substrate passes through the via conductive structure. Optionally, at least two EIC chips may be provided and the at least two EIC chips include a first EIC chip and a second EIC chip. A packaging material is provided between the first EIC chip and the second EIC chip and at least one via conductive structure is provided in the packaging material.

A person of ordinary skill in the art should understand that the various embodiments and examples disclosed herein are described for purpose of illustration only. It is not intended to be exhaustive or to limit the invention. Many modifications and variations are possible in light of the above teaching and the scope of the appended claims should be construed as broadly as the prior art will permit. For example, in alternative embodiments of the present invention, in addition to the RDL layer and the via conductive

9 | 10 structure, the connection structure 400 may also use other suitable electrical connection structures known in the art.

What We claimed is:

1. A semiconductor device comprising:
   a substrate;
   a photonic integrated circuit (PIC) chip, wherein the PIC chip comprises a PIC wiring structure;
   an electronic integrated circuit (EIC) chip disposed between the PIC chip and the substrate, and electrically connected to the PIC chip, wherein the EIC chip comprises an EIC wiring structure; and
   an electrical connection path from the PIC chip to the substrate, which successively passes through the PIC wiring structure and the EIC wiring structure.

2. The semiconductor device of claim 1, further comprising: a packaging material disposed in at least a portion of the periphery of the EIC chip, a via conductive structure disposed in the packaging material, and an electrical connection path from the PIC chip to the substrate, wherein the electrical connection path passes through the via conductive structure.

3. The semiconductor device of claim 2, wherein the projected area of the PIC chip facing the substrate is greater than the sum of the projected areas of at least one EIC chip facing the substrate.

4. The semiconductor device of claim 1, further comprising at least one structure of a PIC rewiring structure, a first bonding structure, a first EIC rewiring structure, a second EIC rewiring structure, a via conductive structure, and a second bonding structure, wherein the at least one structure is configured such that:
   the electrical connection path from the PIC wiring structure to the EIC wiring structure successively passes through at least one of the PIC rewiring structure, the first bonding structure, the first EIC rewiring structure, and/or
   the electrical connection path from the EIC wiring structure to a substrate wiring structure successively passes through at least one of the second EIC rewiring structure, the via conductive structure, and the second bonding structure.

5. The semiconductor device of claim 1, further comprising:
   a first bonding structure for connecting the EIC chip to the PIC chip; and
   a connection structure for connecting the EIC chip to the substrate, including:
      a first segment electrically connected to the first bond structure,
      a second segment electrically connected to the first segment, and
      a second bonding structure for connecting the second segment to the substrate.

6. The semiconductor device of claim 5, wherein the first segment of the connecting structure extends laterally from the connection point of the first bonding structure on the EIC chip beyond the EIC chip; and wherein the second segment of the connecting structure extends longitudinally from the first segment of the connecting structure toward the substrate and terminates at the second bonding structure.

7. The semiconductor device of claim 6, further comprising a packaging material disposed in at least a portion of the periphery of the EIC chip surrounding the second segment of the connecting structure.

8. The semiconductor device of claim 5, further comprising a packaging material disposed in at least a portion of the periphery of the EIC chip surrounding the second segment of the connecting structure.

9. The semiconductor device of claim 1, wherein the projected area of the PIC chip facing the substrate is greater than the sum of the projected areas of at least one EIC chip facing the substrate.

10. The semiconductor device of claim 1, comprising:
    at least two EIC chips including a first EIC chip and a second EIC chip;
    a packaging material disposed between the first EIC chip and the second EIC chip; and
    at least one via conductive structure disposed in the packaging material.

11. The semiconductor device of claim 10, wherein two or more via conductive structures disposed around the first EIC chip, among which at least one via conductive structure whose wiring distance from the first EIC chip is not the farthest is connected to the first EIC chip.

12. A method for manufacturing a semiconductor device, comprising:
    providing a substrate, an electronic integrated circuit (EIC) chip comprising an EIC wiring structure, and a photonic integrated circuit (PIC) chip comprising a PIC wiring structure;
    electrically connecting the EIC chip and the substrate; and
    electrically connecting the EIC chip and the PIC chip such that the EIC chip is disposed between the PIC chip and the substrate; and
    providing an electrical connection path from the PIC chip to the substrate which successively passes through the PIC wiring structure and the EIC wiring structure.

13. The method of claim 12, further comprising:
    disposing a packaging material in at least a portion of the periphery of the EIC chip; and
    providing a via conductive structure in the packaging material;
    wherein the electrical connection path from the PIC chip to the substrate passes through the via conductive structure.

14. The method of claim 12, further comprising:
    providing at least two EIC chips including a first EIC chip and a second EIC chip;
    disposing a packaging material between the first EIC chip and the second EIC chips; and
    providing at least one via conductive structure in the packaging material.

* * * * *